(12) United States Patent
Choi (10) Patent No.: US 8,127,692 B2
(45) Date of Patent: *Mar. 6, 2012

(54) RACK FOR SUPPORTING LIQUID CRYSTAL DISPLAY DEVICES

(75) Inventor: Lee-Ho Choi, Gyeongsangnam-Do (KR)

(73) Assignee: LG Display Co., Ltd., Seoul (KR)

( * ) Notice: Subject to any disclaimer, the term of this patent is extended or adjusted under 35 U.S.C. 154(b) by 336 days.

This patent is subject to a terminal disclaimer.

(21) Appl. No.: 11/712,445

(22) Filed: Mar. 1, 2007

(65) Prior Publication Data

US 2007/0210020 A1    Sep. 13, 2007

Related U.S. Application Data

(62) Division of application No. 10/876,711, filed on Jun. 28, 2004, now Pat. No. 7,188,736.

(30) Foreign Application Priority Data

Dec. 13, 2003  (KR) .............................. 2003-0090981

(51) Int. Cl.
*A47B 81/00* (2006.01)
(52) U.S. Cl. ........ 108/59; 206/454; 211/41.14; 211/153
(58) Field of Classification Search .................... 211/40, 211/41.14, 41.15, 41.17, 41.18, 153; 206/449, 206/454, 455, 456, 832; 312/265.1, 265.4, 312/351; 108/180, 187, 193, 59; 34/239, 34/611

See application file for complete search history.

(56) References Cited

U.S. PATENT DOCUMENTS

| 3,220,557 | A |   | 11/1965 | Brander |
| 3,682,083 | A |   | 8/1972  | Puente |
| 4,630,550 | A | * | 12/1986 | Weitzman ..................... 108/180 |
| 4,691,995 | A |   | 9/1987  | Yamazaki et al. |
| 4,733,781 | A |   | 3/1988  | Gerlach |
| 4,872,554 | A |   | 10/1989 | Quernemoen |
| 5,636,960 | A |   | 6/1997  | Hiroki et al. |

(Continued)

FOREIGN PATENT DOCUMENTS

JP          6-235925         8/1994

(Continued)

*Primary Examiner* — Michael Safavi
(74) *Attorney, Agent, or Firm* — McKenna Long & Aldridge, LLP (57) ABSTRACT

A structure for racking substrates includes first to fourth main legs isolated from one another at intervals wider than widths of both long sides and both short sides of a substrate, first to fourth protrusions respectively protruded from the first to fourth main legs in a direction of the long sides or the short sides of the substrate, a first side support bar coupled to the first and second protrusions and supporting an edge of one long side or one short side of the substrate, a second side support bar coupled to the third and fourth protrusions and supporting an edge of the other long side or the other short side of the substrate, at least one auxiliary leg disposed between the first and second main legs, or the second and third main legs, or the third and fourth main legs, or the fourth and first main legs, and at least two central support bars coupled to the auxiliary leg, extended parallel to the long sides or the short sides of the substrate, and supporting a central portion of the substrate.

3 Claims, 7 Drawing Sheets

U.S. PATENT DOCUMENTS

| | | |
|---|---|---|
| 5,823,361 A | 10/1998 | Babbs |
| 5,853,214 A | 12/1998 | Babbs et al. |
| 5,890,598 A | 4/1999 | Hayashida et al. |
| 6,186,344 B1 | 2/2001 | Park et al. |
| 6,273,275 B1 | 8/2001 | Kim et al. |
| 6,615,994 B2 | 9/2003 | Cu, Jr. |
| D485,413 S | 1/2004 | Yamamoto et al. |
| 2003/0173316 A1 | 9/2003 | Park et al. |
| 2004/0164035 A1 | 8/2004 | Jang |
| 2006/0011507 A1 | 1/2006 | Uchida et al. |
| 2006/0016709 A1 | 1/2006 | Chen et al. |
| 2006/0016770 A1 | 1/2006 | Liu |

FOREIGN PATENT DOCUMENTS

| | | |
|---|---|---|
| JP | 8-101395 | 4/1996 |
| JP | 9-61829 | 3/1997 |
| JP | 10-177178 | 6/1998 |
| JP | 10-333157 | 12/1998 |
| JP | 10-333159 | 12/1998 |
| JP | 11-133438 | 5/1999 |
| JP | 11-142864 | 5/1999 |
| JP | 11-248930 | 9/1999 |
| JP | 11-326922 | 11/1999 |
| KR | 10-2003-0049540 | 6/2003 |
| KR | 10-2003-0075089 | 9/2003 |
| KR | 10-2003-0075327 | 9/2003 |

* cited by examiner

FIG. 1

PRIOR ART

RACK FOR SUPPORTING LIQUID CRYSTAL DISPLAY DEVICES

This application is a Divisional of application Ser. No. 10/876,711 filed Jun. 28, 2004 now U.S. Pat. No. 7,188,736, which is hereby incorporated by reference as if fully set forth herein. The present invention claims the benefit of Korean Patent Application No. 2003-0090981 filed in Korea on Dec. 13, 2003, which is hereby incorporated by reference.

BACKGROUND OF THE INVENTION

1. Field of the Invention

The present invention relates to a structure for racking substrates, and more particularly, to a structure for racking substrates capable of distributing a load of a large-size mother substrate when a desired process is performed after the large-size mother substrate used to fabricate a liquid crystal display device has been loaded.

2. Discussion of the Related Art

In general, in a liquid crystal display device, a plurality of thin film transistor array substrates is formed on a large-size first mother substrate. A plurality of color filter substrates is formed on a large-size second mother substrate. Then, the first and second mother substrates are attached to each other, thereby forming a plurality of liquid crystal display panels at the same time. Thus, this process improves the yield of liquid crystal display panels.

Spacers are formed within the first and second mother substrates to precisely and uniformly maintain a cell-gap between the thin film transistor array substrates and the color filter substrates. Moreover, a liquid crystal layer is formed at the cell-gap.

The spacers can be formed by a dispersing method. In the dispersing method, particles such as a glass bead, a plastic bead, or the like having a certain diameter are dispersed with a uniform density on the first or second mother substrates, to thereby form the spacers. In such a dispersing method, the spacers may be formed at an effective display area since the particles such as a glass bead, a plastic bead, or the like are randomly dispersed on the first or second mother substrates.

The dispersing method has the following problems. Light transmitted within the effective display area is cut or diffused by the spacers. Moreover, leakage of light occurs since alignment of a liquid crystal layer may be crooked in an area where the spacers are located. Thus, an image quality of the liquid crystal display device is degraded. Degradations in image quality, such as blots, occur specially in large-size liquid crystal display devices because the spacers locally lump.

To solve such problems, a photolithography method for forming the spacers has been proposed. In the photolithography method, a photoresist film is applied on the first or second mother substrate. Ultraviolet light is selectively radiated on the photoresist film through a mask having a light cutting area and a transmitting area. Then, the photoresist film is developed. Accordingly, the photoresist film remains locally on the substrate. Thus, patterned spacers or column spacers are formed.

The patterned spacers or the column spacers formed by the photolithography method may overlap a black matrix formed at the second mother substrate. For this reason, deterioration in an aperture ratio and image quality of a liquid crystal display device may be prevented. In addition, a cell-gap between the first and second mother substrates is accurately maintained because the cell-gap between the first and second mother substrates may be controlled by a thickness of the photoresist film. Accordingly, the photolithography method is mainly used in fabricating a large-size liquid crystal display device.

The first and second mother substrates between which the spacers are formed are attached to each other by a sealant. The sealant generally is formed along an outer edge of an effective display area of the first mother substrate or the second mother substrate.

The cell-gap between the first and second mother substrates is maintained by the spacers, and the first and second mother substrates are temporarily attached to each other by a sealant and then transported to hardening equipment. While the sealant hardens in the hardening equipment, the first and second mother substrates are attached to each other. Here, the temporarily attached first and second mother substrates are loaded by a robot-arm onto a racking structure provided in the hardening equipment.

To harden the sealant of the temporarily attached first and second mother substrates in the hardening equipment, annealing is performed at generally over 100° C. for about an hour. The hardening equipment includes the racking structure at which the temporarily attached first and second mother substrates are racked.

Figure 1:
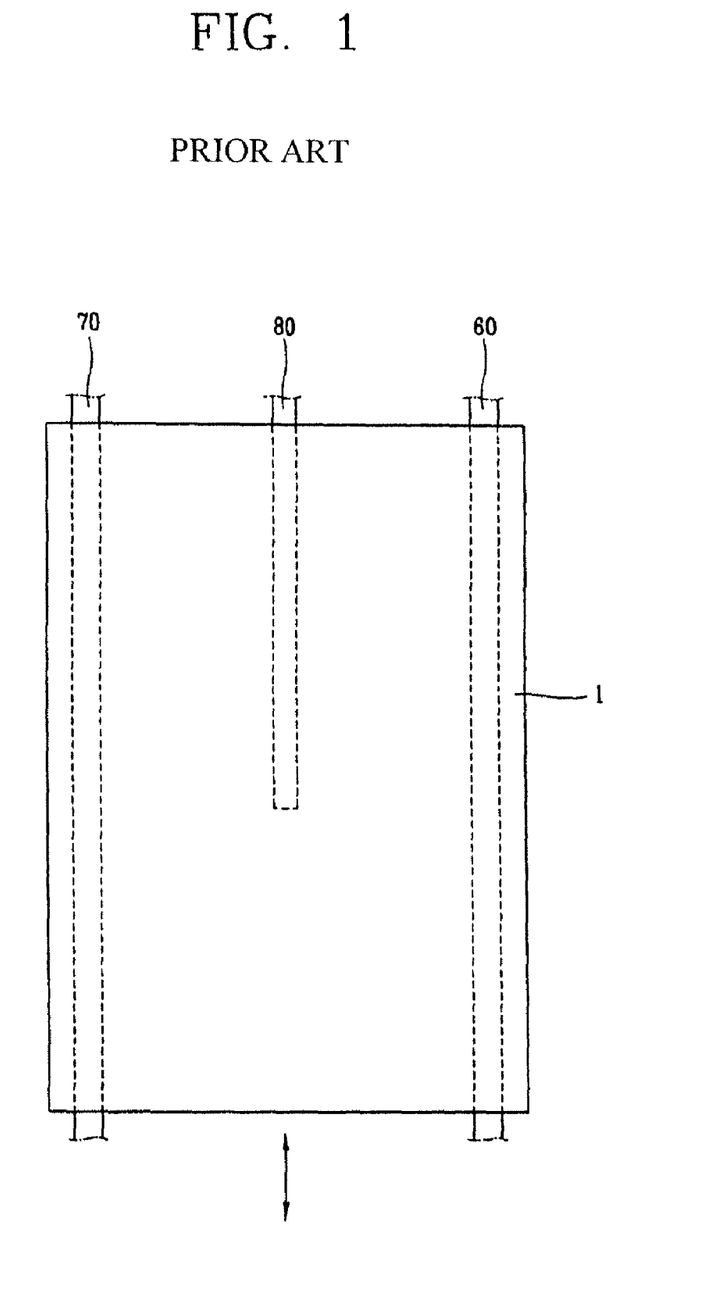
FIG. 1 is a plane view of a racking structure provided in hardening equipment according to related art.

FIG. 1 is a plane view of a racking structure provided in hardening equipment according to related art. As shown in FIG. 1, the racking structure supports edges of both long sides of a substrate 1 through first and second side support bars 60 and 70. The racking structure supports the central portion of the substrate 1 through a central support bar 80.

The substrate 1 includes a large-size first mother substrate and a large-size second mother substrate. The large-size first mother substrate includes a plurality of thin film transistor array substrates. The large-size second mother substrate includes a plurality of color filter substrates. The large-size first and second mother substrates are separated from each other by spacers and are temporarily attached by a sealant. The substrate 1 is racked on the racking structure provided in the hardening equipment.

The substrate 1, including the temporarily-attached first and second mother substrates, increases in size and load in relation to the size of a liquid crystal display panel. However, in comparison, a thickness of the substrate 1 is very small due to a requirement for a thin liquid crystal display device.

Accordingly, if the first and second side support bars 60 and 70 support only edges of both long sides of the large-size substrate 1, any increase in size and load while maintaining a small thickness will cause the central portion of the substrate 1 to bend toward the ground. To support the central portion of the substrate 1 and thus prevent the center portion from bending toward the ground, the central support bar 80 supports the central portion of the substrate 1.

However, in the racking structure of the related art as described above, a load is concentrated on an area where an end of the central support bar 80 and the substrate 1 are in contact. Thus, the patterned spacers or the column spacers formed between the first and second mother substrates collapse or twist in the area where an end of the central support bar 80 and the substrate 1 are in contact.

When the patterned spacers or the column spacers collapse or twist as set forth above, a constant cell-gap may not be maintained between the first and second mother substrates. Thus, the collapse of the spacers causes degradations in image quality of a liquid crystal display device and particularly causes the occurrence of a black spot.

SUMMARY OF THE INVENTION

Accordingly, the present invention is directed to a structure for racking substrates that substantially obviates one or more of the problems due to limitations and disadvantages of the related art.

An object of the present invention is to provide a structure for racking substrates capable of distributing a load of a mother substrate when a desired process is performed after a large-size mother substrate used to fabricate a liquid crystal display device has been loaded.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, the structure for racking substrates includes first to fourth main legs isolated from one another at intervals wider than widths of both long sides and both short sides of a substrate, first to fourth protrusions respectively protruded from the first to fourth main legs in a direction of the long sides or the short sides of the substrate, a first side support bar coupled to the first and second protrusions and supporting an edge of one long side or one short side of the substrate, a second side support bar coupled to the third and fourth protrusions and supporting an edge of the other long side or the other short side of the substrate, at least one auxiliary leg disposed between the first and second main legs, or the second and third main legs, or the third and fourth main legs, or the fourth and first main legs, and at least two central support bars coupled to the auxiliary leg, extended parallel to the long sides or the short sides of the substrate, and supporting a central portion of the substrate.

In another aspect, the structure for racking substrates includes first and second main legs isolated from each other at an interval wider than a width of both long sides or short sides of a substrate, third and fourth main legs isolated from each other at an interval wider than the width of the long sides or the short sides of the substrate, and isolated from the first and second main legs at an interval wider than the width of the short sides or the long sides of the substrate, first to fourth slot members respectively protruded from the first to fourth main legs in a direction of the short sides or the long sides of the substrate, a first side support bar coupled to the first and second slot members and supporting an edge of one long side or one short side of the substrate, a second side support bar coupled to the third and fourth slot members and supporting an edge of the other long side or the other short side of the substrate, an auxiliary leg coupled to an auxiliary guide extended from the first slot member and disposed between the first and fourth main legs, and first and second central support bars coupled to the auxiliary leg, extended parallel to the long sides or the short sides of the substrate, and supporting the central portion of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, examples of which are illustrated in the accompanying drawings.

Figure 2:
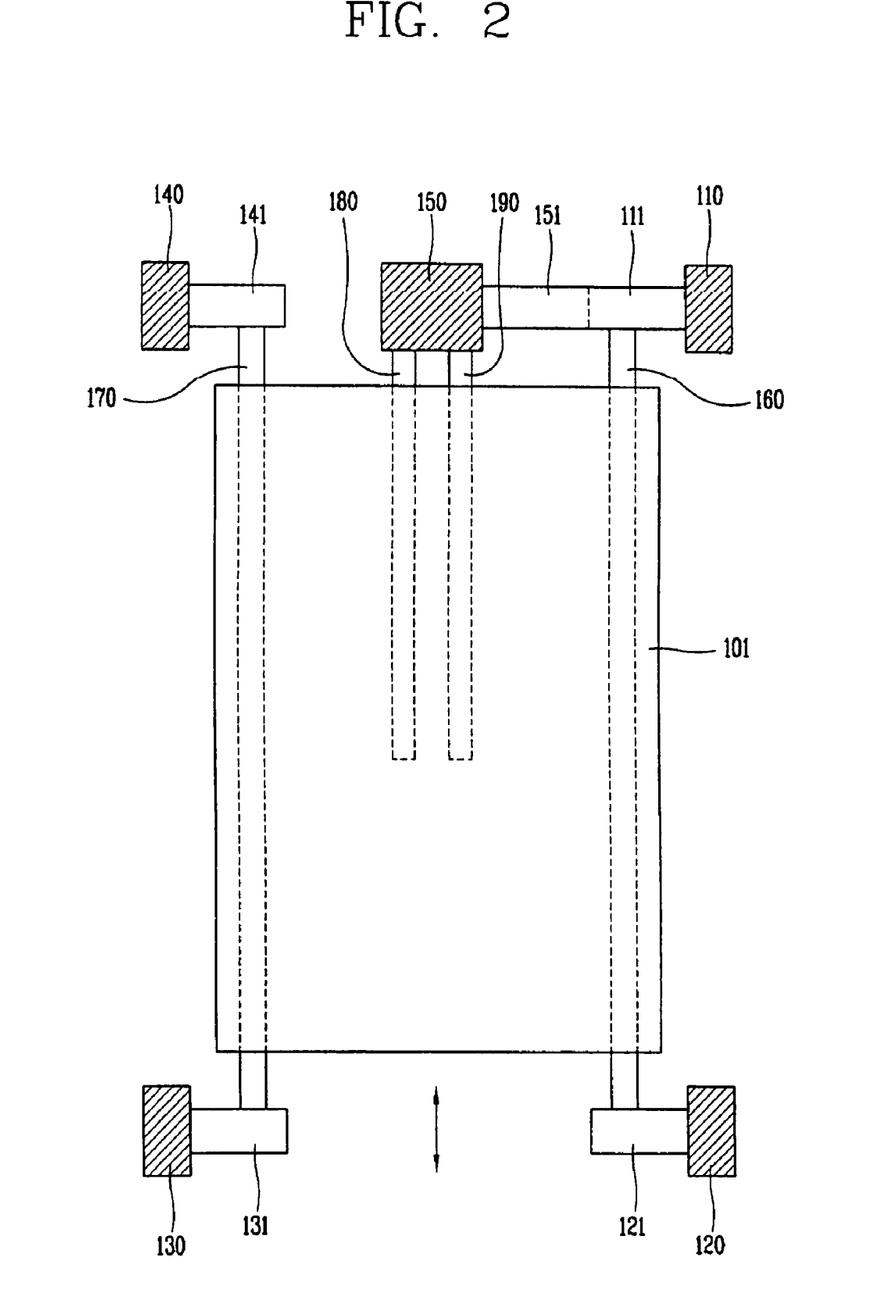
FIG. 2 is a plane view of an exemplary racking structure in accordance with a first embodiment of the present invention.

FIG. 2 is a plane view of an exemplary racking structure in accordance with a first embodiment of the present invention. Referring to FIG. 2, a racking structure in accordance with a first embodiment of the present invention includes first and second main legs 110 and 120. The first and second main legs are isolated from each other at an interval wider than a width of both long sides of a substrate 101. The racking structure also includes third and fourth main legs 130 and 140. The third and fourth main legs are isolated from each other at an interval wider than the width of the long sides of the substrate 101. The third and fourth main legs are also isolated from the first and second main legs 110 and 120 at an interval wider than a width of both short sides of the substrate 101.

The racking structure further includes first to fourth slot members 111, 121, 131 and 141. The first to fourth slots are respectively protruded from the first to fourth main legs 110, 120, 130 and 140 in a direction of the short sides of the substrate 101.

The racking structure further includes a first side support bar 160 coupled to the first and second slot members 111 and 121 and supporting an edge of one long side of the substrate 101. The racking structure further includes a second side support bar 170 coupled to the third and fourth slot members 131 and 141 and supporting an edge of the other long side of the substrate 101.

The racking structure further includes an auxiliary leg 150. The auxiliary leg 150 is coupled to an auxiliary guide 151, which extends from the first slot member 111 and is disposed between the first and fourth main legs 110 and 140.

The racking structure further includes first and second central support bars 180 and 190 coupled to the auxiliary leg 150. The first and second central support bars extend parallel to the long sides of the substrate 101 and support a central portion of the substrate 101.

Figure 3:
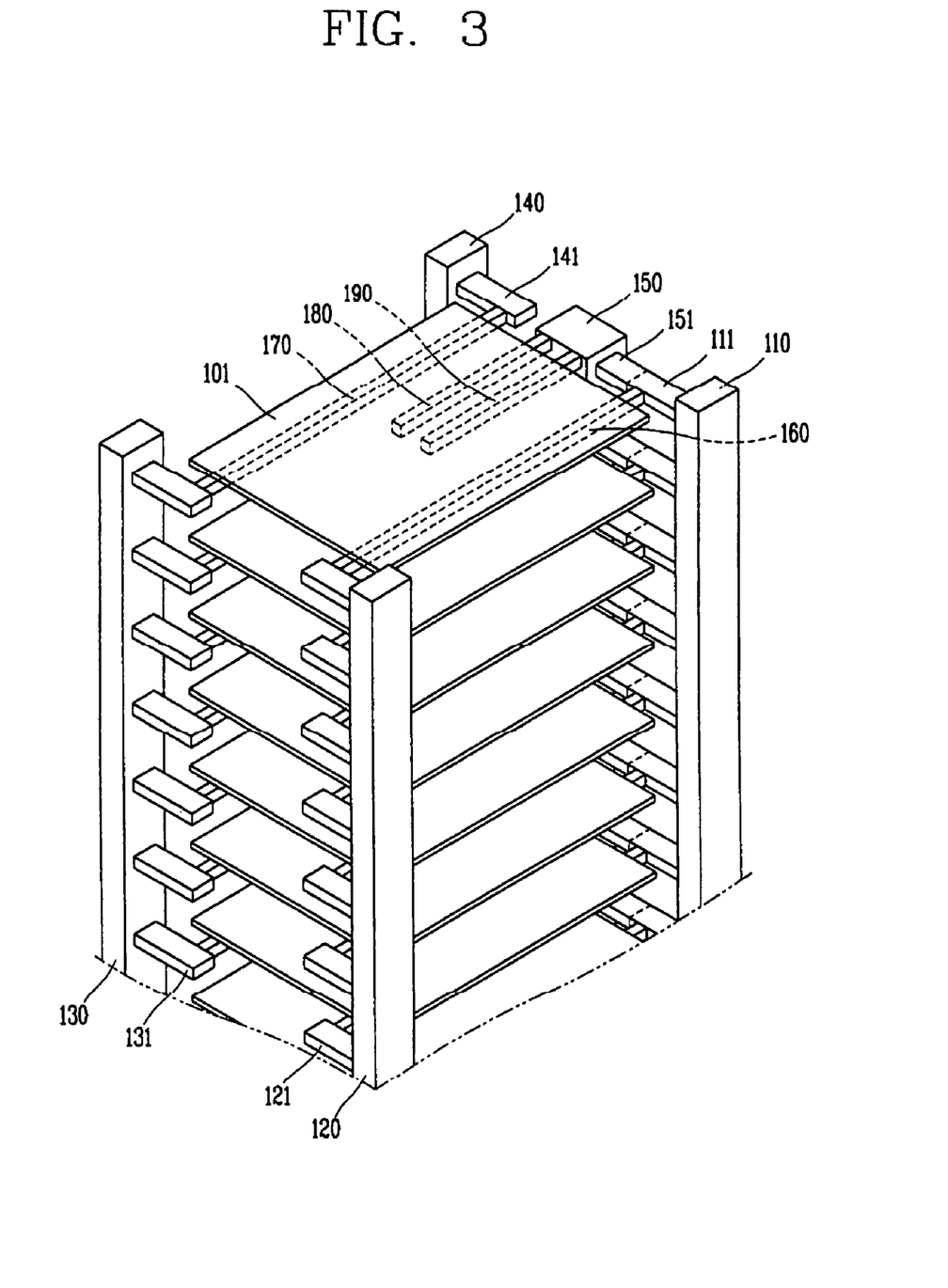
FIG. 3 is a perspective view of an exemplary racking structure in accordance with the first embodiment of the present invention.

FIG. 3 is a perspective view of an exemplary racking structure in accordance with a first embodiment of the present invention. As shown in FIG. 3, in the racking structure in accordance with the first embodiment of the present invention, the first to fourth slot members 111, 121, 131 and 141, the first and second side support bars 160 and 170, and the first and second central support bars 180 and 190 are formed in multiple layers with pitches along the first to fourth main legs 110, 120, 130 and 140 and the auxiliary leg 150. Further, the substrate 101 is supported and racked on each layer.

Figure 8:
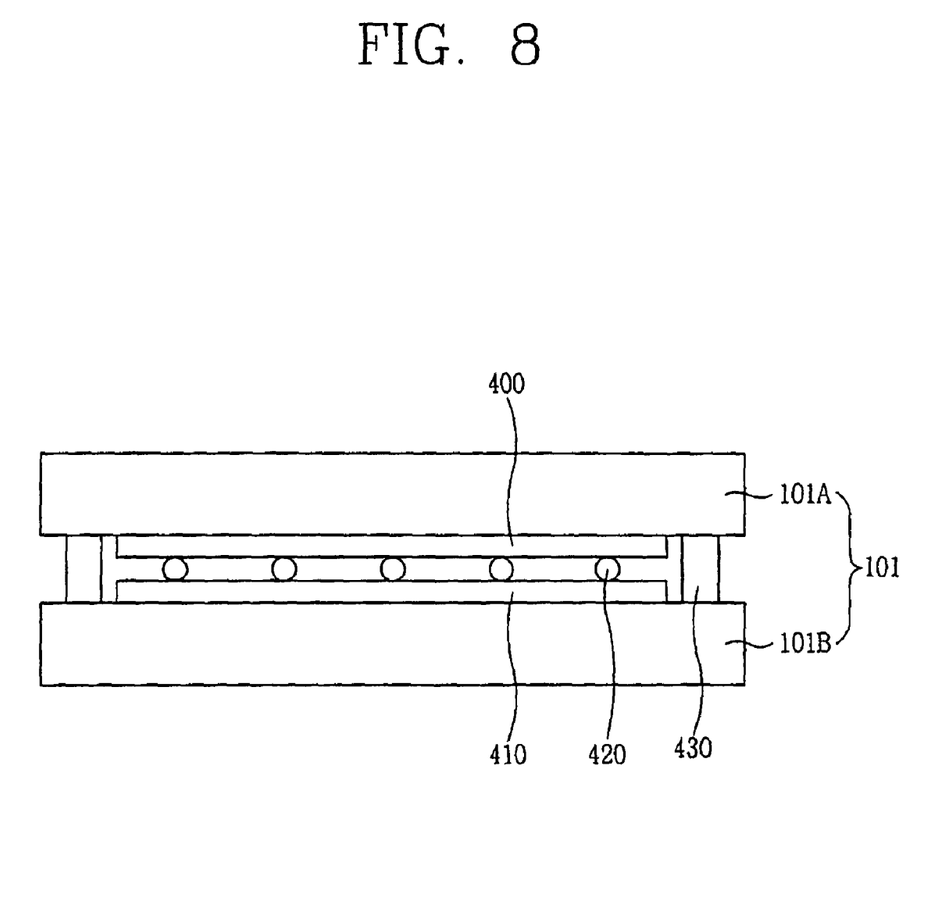
FIG. 8 is a view of an exemplary substrate including a first mother substrate and a second mother substrate.

A substrate 101 is racked on the racking structure provided in hardening equipment. As shown in FIG. 8, the substrate 101 includes a large-size first mother substrate 101A and a large-size second mother substrate 101B. The first mother substrate 101A includes a plurality of thin film transistor array substrates 400. The large-size second mother substrate 101B includes a plurality of color filter substrates 410. The large-size first and second mother substrates 101A and 101B are distanced from each other by spacers 420 and are temporarily attached by a sealant 430.

A cell-gap between the first and second mother substrates is maintained by the spacers. The first and second mother substrates are temporarily attached to each other by the sealant and then transported to hardening equipment to be racked on the racking structure. The first and second mother substrates are attached to each other by the hardening of the sealant in the hardening equipment. Herein, the applied sealant may be a thermo-hardening sealant, or an ultraviolet light-hardening sealant, or a mixture of the thermo-hardening sealant and the ultraviolet light-hardening sealant.

In accordance with an embodiment of the present invention, the racking structure may be provided with a thereto-hardening furnace or an ultraviolet light-hardening furnace for hardening the sealant. Alternatively, the racking structure may be provided in a thermo-hardening furnace for thermo-hardening the sealant after the sealant has been hardened through ultraviolet light.

A liquid crystal layer may be formed at the cell-gap between the first and second mother substrates. According to a fabrication method of the liquid crystal layer, the first and second mother substrates may be racked on the racking structure. In an embodiment, the first and second mother substrates may include a liquid crystal layer at the cell-gap. In another embodiment, the first and second mother substrates may not include a liquid crystal layer at the cell-gap.

The liquid crystal layer may be formed by a vacuum injection method. In the vacuum injection method, an opening is formed in a portion of the seal pattern of the liquid crystal display panel. The opening functions as a liquid crystal injection hole. The liquid crystal injection hole is dipped in a container filled with the liquid crystal in a vacuum chamber. Then, the liquid crystal is injected into the liquid crystal display panel by a pressure difference between the inner side and the outer side of the liquid crystal display panel by varying a vacuum level. After the liquid crystal is filled in the liquid crystal display panel, the liquid crystal injection hole is sealed, thereby forming a liquid crystal layer of the liquid crystal display panel.

The vacuum injection method as described above has the following problems. The fabrication time is long as a result of the long filling time of the liquid crystal. Thus, productivity suffers from the long fabrication time. In addition, the filling time increases in relation with the size of the liquid crystal display panel. Moreover, filling defects may occur. Therefore, the vacuum injection method is not suitable for a large-size liquid crystal display panel.

In addition, an excessive amount of liquid crystal is consumed in the vacuum injection method. In general, an effective amount of the liquid crystal is very small compared to the amount of the liquid crystal filled in the container. Moreover, when liquid crystal is exposed to air or a specific gas, it reacts with the gas and degrades. Thus, even if the liquid crystal is filled within a plurality of liquid crystal display panels, a large amount of the liquid crystal remains after the filling process. Such remaining liquid crystal is discarded. As a result, a unit price of the liquid crystal display increases.

A dropping method has been proposed to overcome such problems of the vacuum injection method. In the dropping method, the liquid crystal is dropped and dispensed at an image display part of the first mother substrate or the second mother substrate. Accordingly, the liquid crystal is uniformly distributed at the entire image display part by the pressure generated when the first and second mother substrates are attached to each other, thereby forming a liquid crystal layer.

In the dropping method, the liquid crystal may be dropped within a short time in comparison with the vacuum injection method. Thus, for a large-size liquid crystal display panel, a liquid crystal layer can be quickly formed between the substrates. Moreover, since only a required amount of the liquid crystal is dropped on the first mother substrate or the second mother substrate, the unit price of the liquid crystal display panel can be reduced in comparison with the vacuum injection method.

In the dropping method, the liquid crystal is not filled externally. The liquid crystal is directly dropped onto the first mother substrate or the second substrate. Thus, the seal pattern is given a closed pattern shape encompassing the outer edge of the image display part to prevent an leakage of the liquid crystal out of the image display part.

In the vacuum injection method, the first and second mother substrates are attached, processed and cut into individually separate liquid crystal display panels. Then, a liquid crystal is injected through a liquid crystal injection hole. Accordingly, a liquid crystal layer is not formed at a cell-gap between the first and second mother substrates racked on the racking structure in accordance with an embodiment of the present invention.

In contrast, in the dropping method, a liquid crystal layer is formed by dropping a liquid crystal layer onto the first mother substrate or the second mother substrate. Then, the first and second mother substrates are attached to each other. Thus, a liquid crystal layer is formed at a cell-gap between the first and second substrates racked on the racking structure in accordance with an embodiment of the present invention.

The first and second mother substrates are loaded by a robot-arm onto the racking structure within hardening equipment. When using a thereto-hardening sealant, or a mixture of an ultraviolet light-hardening sealant and a thermo-hardening sealant, annealing is performed in the hardening equipment generally at over 100° C. for about an hour to harden the sealant of the temporarily attached first and second mother substrates.

The substrate 101 including the temporarily-attached first and second mother substrates increases in size and load in relation to the size of the liquid crystal display panel. But a thickness of the substrate 101 is very small due to a requirement for a thin liquid crystal display device.

Accordingly, when the first and second side support bars 160 and 170 support only edges of both long sides of a large-size substrate 101 increased in size and load but maintaining a small thickness, a central portion of the substrate 101 bends toward the ground. The auxiliary leg 150 is installed to support the central portion of the substrate 101 and thus prevent the central portion from bending toward the ground. The first and second central support bars 180 and 190 are coupled to the auxiliary leg 150, to thereby support the central portion of the substrate 101.

In contrast, in FIG. 1, since one central support bar 80 supports the central portion of the substrate 1, a load is concentrated on an area where an end of the central support bar 80 and the substrate 1 are in contact. For this reason, patterned spacers or column spacers formed between the first and second mother substrates collapse or twist in the area where the end of the central support bar 80 and the substrate 1 are in contact.

In the racking structure in accordance with the first embodiment of the present invention, as shown in FIGS. 2 and 3, the first and second central support bars 180 and 190 coupled to the auxiliary leg 150 support the central portion of the substrate 101. Thus, the load of the substrate 101 may be distributed. Accordingly, the patterned spacers or the column spacers formed between the first and second mother substrates may be prevented from collapsing and twisting in the area where the ends of the first and second central support bars 180 and 190 and the substrate 101 are in contact.

The ends of the first and second central support bars 180 and 190 extend up to at least the center of the substrate 101, parallel to a long side of the substrate 101 and may reach an end of a short side of the substrate 101. Alternatively, the ends of the first and second central support bars 180 and 190 may protrude from the end of the short side of the substrate 101.

Here, by constructing the lengths of the first and second central support bars 180 and 190 to be twice (about 800~1000 mm) as long as the central support bar 80 depicted in FIG. 1, the concentration of a load occurring at the central portion of the substrate 101 may be distributed. Moreover, the ends of first and second central support bars 180 and 190 may be connected to each other by a connection part or may be formed as one body. In this case, the load of the substrate 101 may be effectively distributed.

Figure 4:
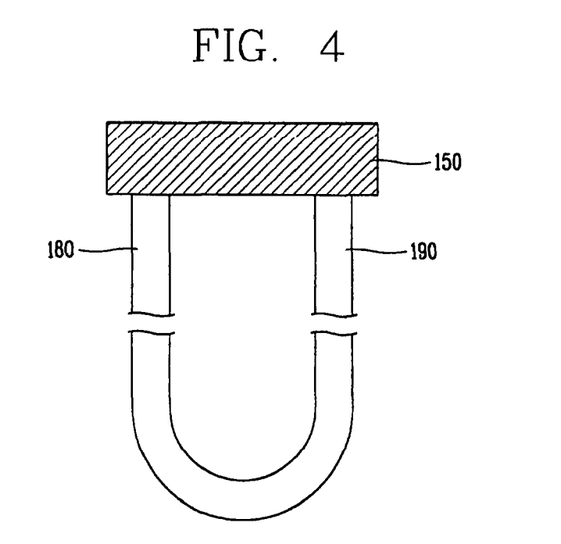
FIG. 4 is an exemplary view showing that both ends of first and second central support bars are connected in a circular shape in the racking structure of FIG. 2.

FIG. 4 is an exemplary view showing that both ends of first and second central support bars are connected in a circular shape in the racking structure of FIG. 2. As shown in FIG. 4, if the first and second central support bars 180 and 190 coupled to the auxiliary leg 150 are formed as one unit with their ends connected in a circular shape, a load of the substrate 101 is more effectively distributed.

In FIGS. 2 and 3, the auxiliary guide 151 extends from a first slot member 111 of the first main leg 110 and is coupled to the auxiliary leg 150. But, the auxiliary guide 151 may extend from a fourth slot member 141 of the fourth main leg 140 and be coupled to the auxiliary leg 150. Further, a plurality of auxiliary legs 150 may be provided.

Figure 5:
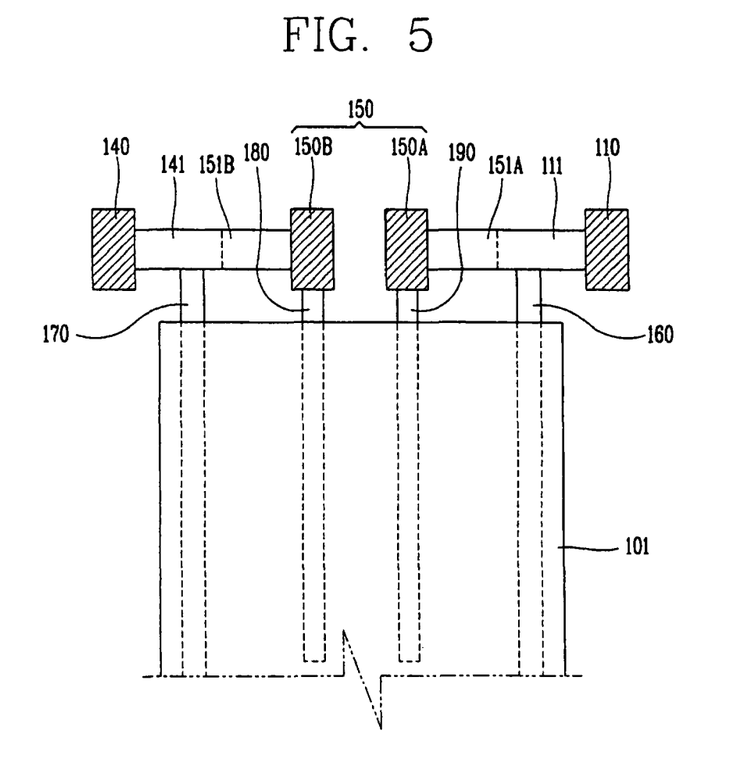
FIG. 5 is a view of a different exemplary auxiliary leg in the racking structure of FIG. 2.

FIG. 5 is a view of a different exemplary auxiliary leg in the racking structure of FIG. 2. The auxiliary leg 150 includes a first auxiliary leg 150A coupled to a first auxiliary guide 151A, which extends from a first slot member 111 of a first main leg 110. The auxiliary leg 150 also includes a second auxiliary leg 150B coupled to a second auxiliary guide 151B, which extends from a fourth slot member 141 of a fourth main leg 140. First and second central support bars 180 and 190 are individually coupled to the first and second auxiliary legs 150A and 150B and support the central portion of the substrate 101. Here, as set forth above, first and second central support bars 180 and 190 are connected to each other by a connection part, may be formed as one unit, or may be formed as one unit with their ends connected in a circular shape.

In the racking structure in accordance with an embodiment of the present invention, the substrate 101 is loaded/unloaded in a direction parallel to the long sides. In such an embodiment, as set forth above, the first and second side support bars 160 and 170 support edges of both long sides of a substrate 101. The first and second central support bars 180 and 190 extend parallel to the long sides of the substrate 101 and support a central portion of the substrate 101.

In the racking structure in accordance with an alternate embodiment of the present invention, the substrate 101 may be loaded/unloaded in a direction parallel to the short sides. In this alternate embodiment, the first and second support bars 160 and 170 support edges of both short sides of the substrate 101. The first and second central support bars 180 and 190 extend parallel to the short sides of the substrate 101 and support the central portion of the substrate 101.

Figure 6:
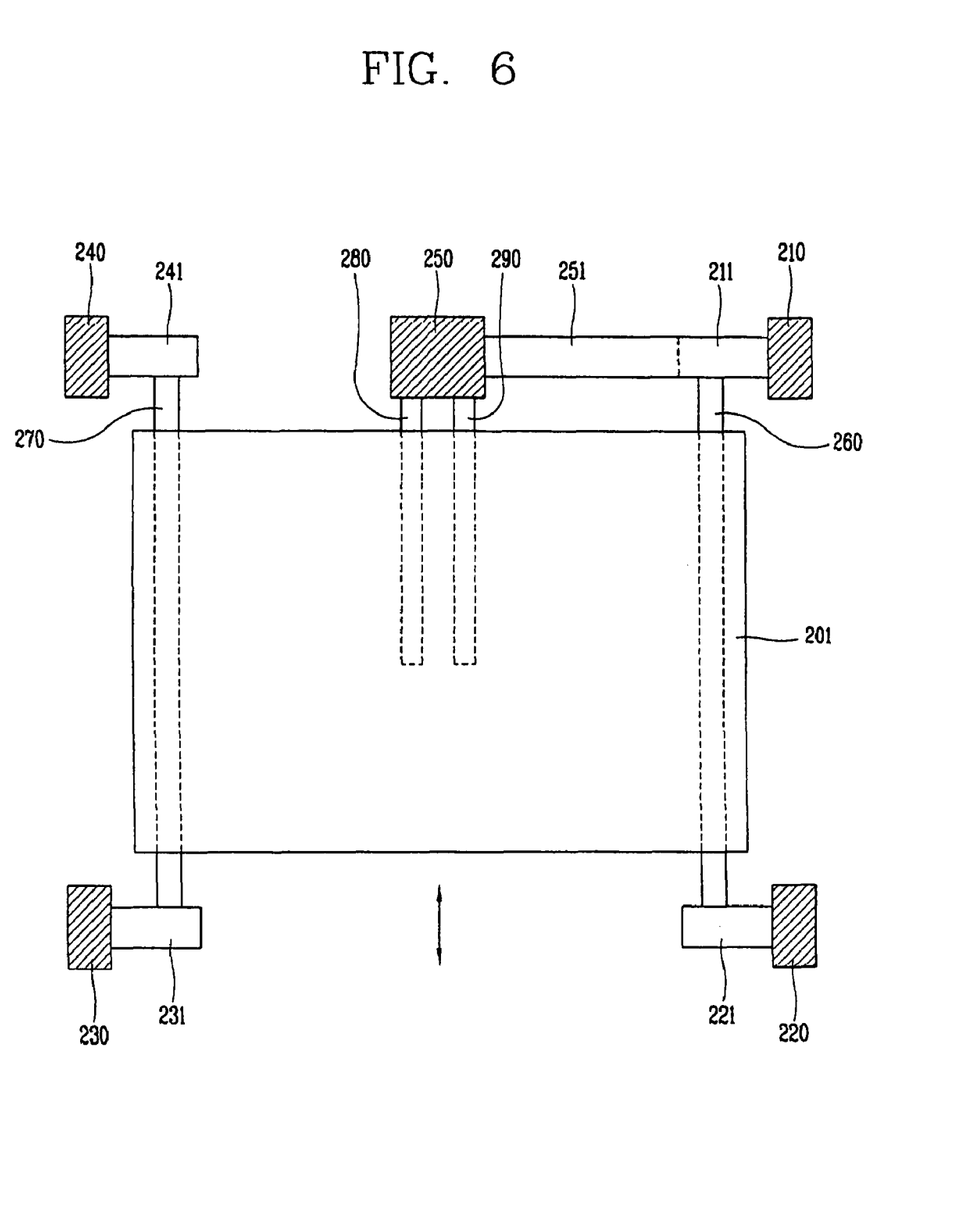
FIG. 6 is a plane view of an exemplary racking structure in accordance with a second embodiment of the present invention.

FIG. 6 is a plane view of an exemplary racking structure in accordance with a second embodiment of the present invention. In FIG. 6, the racking structure includes first and second main legs 210 and 220. The first and second main legs are isolated from each other at an interval wider than a width of both short sides of a substrate 201.

The racking structure further includes third and fourth main legs 230 and 240. The third and fourth main legs are isolated from each other at an interval wider than a width of the short sides of the substrate 201. Moreover, the third and four main legs are isolated from the first and second main legs 210 and 220 at an interval wider than a width of both long sides of the substrate 201.

The racking structure further includes first to fourth slot members 211, 221, 231 and 241. The first to fourth slot members protrude from the first to fourth main legs 210, 220, 230 and 240, respectively, in a direction of the long sides of the substrate 201.

The racking structure further includes a first side support bar 260. The first side support bar is coupled to the first and second slot members 211 and 221 and supports an edge of one short side of the substrate 201. The racking structure includes a second side support bar 270. The second side support bar is coupled to the third and fourth slot members 231 and 241 and supports an edge of the other short side of the substrate 201.

The racking structure further includes an auxiliary leg 250. The auxiliary leg is coupled to an auxiliary guide 251. The auxiliary guide 251 extends from the first slot member 211 and is disposed between the first and fourth main legs 210 and 240.

The racking structure further includes first and second central support bars 280 and 290. The first and second support bars 280 and 290 are coupled to the auxiliary leg 250. The first and second support bars 280 and 290 extend from the auxiliary leg 250 parallel to the short sides of the substrate 201. The first and second support bars 280 and 290 support the central portion of the substrate 201.

As mentioned above, the substrate 201 is racked on the racking structure, and is provided with hardening equipment. The substrate 201 includes a large-size first mother substrate and a large-size second mother substrate. The large-size first mother substrate includes a plurality of thin film transistor array substrates. The large-size second mother substrate includes a plurality of color filter substrates. The large-size first and second mother substrates are distanced from each other by spacers and are temporarily attached by a sealant.

The substrate 201 including the temporarily-attached first and second mother substrates largely increases in size and load when the size of the liquid crystal display panel increases. But a thickness of the substrate 201 is very small due to a requirement for a thin liquid crystal display device.

Accordingly, when the first and second side support bars 260 and 270 support only edges of both short sides of a large-size substrate 201, which is increased in size and load but is maintaining a small thickness, a central portion of the substrate 201 bends toward the ground. The auxiliary leg 250 is installed to support the central portion of the substrate 201 and thus prevent the central portion from bending toward the ground. Moreover, first and second central support bars 280 and 290 are coupled to the auxiliary leg 250 to thereby support the central portion of the substrate 201.

In contrast, in above-mentioned FIG. 1, since one central support bar 80 supports the central portion of the substrate 1 a load is concentrated on an area where an end of the central support bar 80 and the substrate 1 are in contact. As a result, patterned spacers or column spacers formed between the first and second mother substrates collapse or twist in the area where the end of the central support bar 80 and the substrate 1 are in contact.

However, in the racking structure in accordance with the second embodiment of the present invention, as shown in FIG. 6, the first and second central support bars 280 and 290 coupled to the auxiliary leg 250 support the central portion of the substrate 201. Thus, the load of the substrate 201 may be distributed. Accordingly, the patterned spacers or the column spacers formed between the first and second mother substrates do not collapse or twist in the area where the ends of the first and second central support bars 280 and 290 and the substrate 201 are in contact.

The ends of the first and second central support bars 280 and 290 extend up to at least the center of the substrate 201, parallel to short sides of the substrate 201. The ends of the first and second central support bars 280 and 290 may reach an end of a long side of the substrate 201. Alternatively, the ends of the first and second central support bars 280 and 290 may protrude from the end of the long side of the substrate 201. Here, by constructing the lengths of the first and second central support bars 280 and 290 to be about twice (about 800~1000 mm) as long as the central support bar 80 depicted in FIG. 1, the concentration of a load occurring at the central portion of the substrate 201 may be distributed.

In addition, the ends of the first and second central support bars 280 and 290 may be connected to each other by a connection part or formed as one unit. In this case, the load of the substrate 201 may be effectively distributed.

As mentioned above, if the first and second central support bars 280 and 290 coupled to the auxiliary leg 250 are formed as one body with their ends connected in a circular shape as shown in FIG. 4, a load of the substrate 201 may be more effectively distributed.

In FIG. 6, the auxiliary guide 251 extends from the first slot member 211 of the first main leg 210 and is coupled to the auxiliary leg 250. However, the auxiliary guide 251 may extend from the fourth slot member 241 of the fourth main leg 240 and be coupled to the auxiliary leg 250. In addition, two or more auxiliary legs 250 may be provided as depicted in FIG. 5.

In the racking structure in accordance with the first and second embodiments of the present invention set forth above, first and second side support bars 160 and 170, 260 and 270, and first and second central support bars 180 and 190, 280 and 290 should be formed of a heat-resistant material, namely, a material that is not transformed by heat because a loaded substrate 101, 201 is annealed to harden a sealant. Here, the annealing is performed at about 100° C.-200° C. for about 30~90 minutes.

For example, if the first and second central bars 180 and 190, 280 and 290 are easily transformed by heat, the multi-tiered first and second central support bars 180 and 190, 280 and 290 bend toward the ground due to a load of the substrate 101, 201. Then, the bent multi-tiered first and second central support bars 180, 190, 280, 290 collide against a robot-arm that sequentially loads and unloads the substrate 101, 201.

Accordingly, the first and second side support bars 160 and 170, 260 and 270 and the first and second central support bars 180 and 190, 280 and 290 may be formed of a material such as stainless steel, which is not transformed when annealing is performed at about at least 300° C. for a long time, which increases with the number of input substrates.

When the substrates 101, 201 are loaded and supported on first and second side support bars, and first and second central support bars, which are made of stainless steel, the substrate 101, 201 may be damaged due to a slide, a contact and an impact between the stainless steel and the substrate 101, 201. To prevent the substrate 101, 201 from being damaged due to the slide, the contact and the impact between the stainless steel and the substrate 101, 201, surfaces of the first and second side support bars 160 and 170, 260 and 270, and the first and second central support bars 180 and 190, 280 and 290, may be coated with Teflon.

Figure 7A:
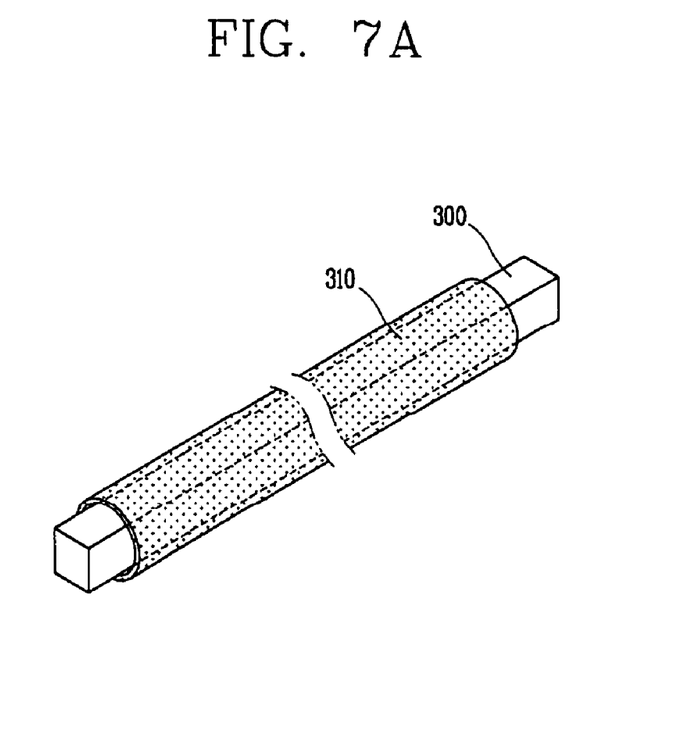
FIGS. 7a and 7h are views of exemplary methods for coating a surface of a support bar with Teflon in the racking structure of FIGS. 2 and 6.
Figure 7B:
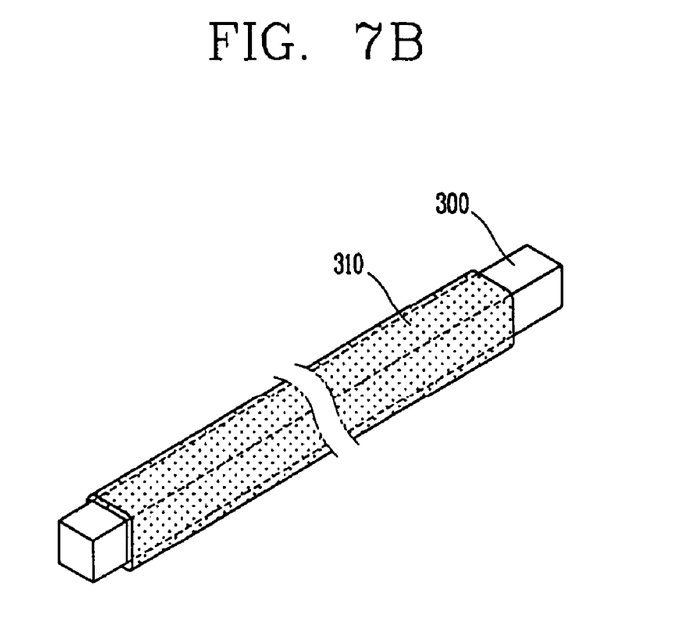

FIGS. 7a and 7b are views of exemplary methods for coating a surface of a support bar with Teflon in the racking structure of FIGS. 2 and 6. First, referring to FIG. 7a, a support bar 300 is inserted into a tube 310 formed of a Teflon material. Then, referring to FIG. 7b, the tube 310 in which the support bar 300 has been inserted is annealed to be contracted. Here, the annealing is performed at 100° C.~200° C. for 10~15 minutes.

The racking structure in accordance with the above-mentioned embodiments of the present invention may disperse a load of a substrate since at least two central support bars support a central portion of the substrate. The racking structure provided with at least two central support bars may be useful in fabricating liquid crystal display devices of various models. Moreover, by using a concept of the present invention, those skilled in the art will easily modify and implement the present invention to fabricate liquid crystal display devices of various models.

The racking structure in accordance with an embodiment of the present invention is fabricated by attaching two large-size substrates for a liquid crystal display device. But by using a concept of the present invention, those skilled in the art will easily modify and implement the present invention not only for liquid crystal display devices applied to a large-size monitor, TV or the like, but also for flat type display devices such as electro luminescent displays (ELD), plasma display panels (PDP), field emission displays (FED) or the like, which are fabricated by attaching two-large sized substrates.

As set forth above, a racking structure in accordance with embodiments the present invention may disperse a load of a large-size substrate since at least two central support bars support a central portion of the large-size substrate including temporarily attached first and second mother substrates. Accordingly, patterned spacers or column spacers formed between the first and second mother substrates may be prevented from collapsing or twisting in an area where ends of at least two central support bars and the substrate are in contact. Accordingly, a uniform cell-gap may be maintained between the first and second mother substrates, whereby degradations, such as black spot, may be prevented in an image of a liquid crystal display device.

It will be apparent to those skilled in the art that various modifications and variations can be made in embodiments the present invention without departing from the spirit or scope of the invention. Thus, it is intended that the present invention cover the modifications and variations of this invention provided they come within the scope of the appended claims and their equivalents.

What is claimed is:

1. A structure for racking substrates, comprising:
first and second main legs isolated from each other at an interval wider than a width of both long sides or short sides of a substrate;
third and fourth main legs isolated from each other at an interval wider than the width of the long sides or the short sides of the substrate, and isolated from the first and second main legs at an interval wider than the width of the short sides or the long sides of the substrate;
a plurality of first to fourth slot members respectively protruding from the first to fourth main legs in a direction of the short sides or the long sides of the substrate, and disposed at multiple layers with pitches along the first to fourth main legs;
a plurality of first side support bars coupled to the first and second slot members and supporting an edge of one long side or one short side of each of a plurality of substrates, and disposed at the multiple layers with pitches along the first to fourth main legs;
a plurality of second side support bars coupled to the third and fourth slot members and supporting an edge of the other long side or the other short side of each of a plurality of substrates, and disposed at the multiple layers with pitches along the first to fourth main legs;
a plurality of auxiliary legs coupled to auxiliary guides extended from the first slot members, wherein each of the auxiliary legs is respectively coupled to each of the first and second main legs, and disposed at the multiple layers with pitches along the first to fourth main legs; and
first and second central support bars coupled to each of the auxiliary legs, extended parallel to the long sides or the short sides of each of the plurality of the substrates, and supporting a central portion of each of the substrates, wherein the multiple layers are formed by the plurality of the first and second side support bars coupled to the first to fourth slot members and the central support bars coupled to the auxiliary legs.

2. The structure of claim 1, wherein the auxiliary leg comprises:
a first auxiliary leg coupled to a first auxiliary guide extended from the first slot member of the first main leg; and
a second auxiliary leg coupled to a second auxiliary guide extended from the fourth slot member of the fourth main leg,
wherein the first and second central support bars are individually coupled to the first and second auxiliary legs.

3. A structure for racking substrates, comprising:
first, second, third and fourth main legs isolated from one another;
a plurality of first, second, third and fourth protrusions protruding from the first, second, third and fourth main legs and disposed at multiple layers with pitches along the first to fourth main legs;
a plurality of first side support bars coupled to the first and second protrusions for supporting an edge of each of a plurality of substrates and disposed at the multiple layers with pitches along the first to fourth main legs;
a plurality of second side support bars coupled to the third and fourth protrusions for supporting another edge of each of the plurality of substrates and disposed at the multiple layers with pitches along the first to fourth main legs;
a plurality of auxiliary legs disposed between the first and fourth main legs, wherein each of the auxiliary legs is respectively coupled to each of the first and second main legs, and disposed at the multiple layers with pitches along the first to fourth main legs;
a plurality of auxiliary guides respectively coupled to the auxiliary legs, wherein each of the auxiliary guides respectively is extended from each of the first and fourth protrusions; and
two central support bars coupled to each of the auxiliary legs for supporting a central portion of each of the substrates,
wherein the multiple layers are formed by the plurality of the first and second side support bars and the central support bars coupled to the auxiliary legs coupled to the first to fourth protrusions.

* * * * *